United States Patent
Chakrabarti et al.

(10) Patent No.: US 9,628,083 B1
(45) Date of Patent: Apr. 18, 2017

(54) LOCAL ROUTING NETWORK WITH SELECTIVE FAST PATHS FOR PROGRAMMABLE LOGIC DEVICE

(71) Applicant: QuickLogic Corporation, Sunnyvale, CA (US)

(72) Inventors: Pinaki Chakrabarti, Bangalore (IN); Vishnu A. Patil, Bangalore (IN); Wilma W. Shiao, San Jose, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 10 days.

(21) Appl. No.: 14/873,077

(22) Filed: Oct. 1, 2015

(51) Int. Cl.
*H03K 19/177* (2006.01)
*H03K 19/0175* (2006.01)

(52) U.S. Cl.
CPC ... *H03K 19/17744* (2013.01); *H03K 19/1774* (2013.01); *H03K 19/17728* (2013.01)

(58) Field of Classification Search
None
See application file for complete search history.

(56) References Cited

U.S. PATENT DOCUMENTS

| | | | | |
|---|---|---|---|---|
| 5,923,195 A * | 7/1999 | Graf, III | ............ | H03K 19/1736 327/141 |
| 6,069,490 A | 5/2000 | Ochotta et al. | | |
| 6,078,191 A * | 6/2000 | Chan | ................ | H03K 19/1737 326/40 |
| 6,107,822 A * | 8/2000 | Mendel | ............ | H03K 19/17704 326/39 |
| 6,118,300 A * | 9/2000 | Wittig | ................ | H03K 19/1737 326/41 |
| 6,426,649 B1 * | 7/2002 | Fu | ..................... | H03K 19/17736 326/38 |
| 6,611,153 B1 * | 8/2003 | Lien | ..................... | G06F 17/5054 326/38 |
| 6,636,070 B1 * | 10/2003 | Altaf | ................ | H03K 19/17736 326/38 |
| 6,650,142 B1 * | 11/2003 | Agrawal | ......... | H03K 19/17728 326/39 |
| 6,960,934 B2 | 11/2005 | New | | |
| 7,009,421 B2 * | 3/2006 | Pugh | ................... | G06F 17/5054 326/38 |
| 7,573,291 B1 * | 8/2009 | Agrawal | ......... | H03K 19/17728 326/38 |

(Continued)

*Primary Examiner* — Crystal L Hammond
(74) *Attorney, Agent, or Firm* — Silicon Valley Patent Group LLP

(57) ABSTRACT

A routing network is associated with a logic island in a logic block of a programmable logic device and includes switches for each of feedback, street, and highway networks. Some of the switches include multiple stages. The street network switch receives the signals from the feedback network switch, signals from neighboring highway network switches, and direct feedback from selected logic island outputs and provides outputs to the logic island. The street network switch includes multiple stages, where outputs to the logic island are provided directly by each stage in the street network switch. The output terminals of a first stage of the street network switch that are connected to the logic island are also connected to the second stage of the street network switch. The second stage of the street network switch receives feedback output signals from the feedback network and directly from the associated logic island.

43 Claims, 8 Drawing Sheets

(56) References Cited

U.S. PATENT DOCUMENTS

| | | | |
|---|---|---|---|
| 7,592,834 B1 * | 9/2009 | Agrawal | H03K 19/17736 326/38 |
| 7,902,864 B1 | 3/2011 | Hutton et al. | |
| 7,924,052 B1 | 4/2011 | Feng et al. | |
| 2001/0052793 A1 * | 12/2001 | Nakaya | H03K 19/17728 326/41 |
| 2004/0001445 A1 * | 1/2004 | Stansfield | G06F 9/3001 370/254 |
| 2004/0010767 A1 * | 1/2004 | Agrawal | G06F 17/5054 716/121 |
| 2005/0257024 A1 * | 11/2005 | Ray | G06F 9/3001 712/11 |

* cited by examiner

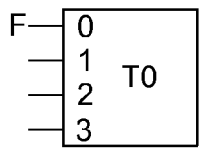
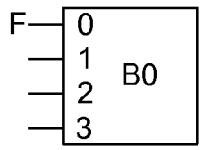
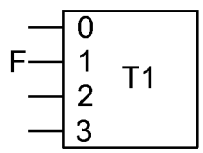
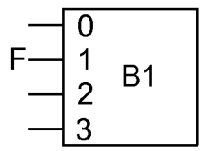
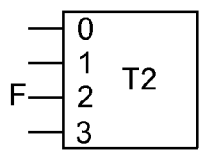
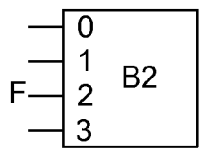
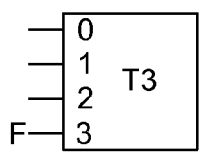
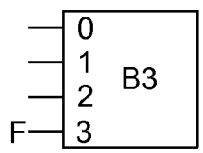
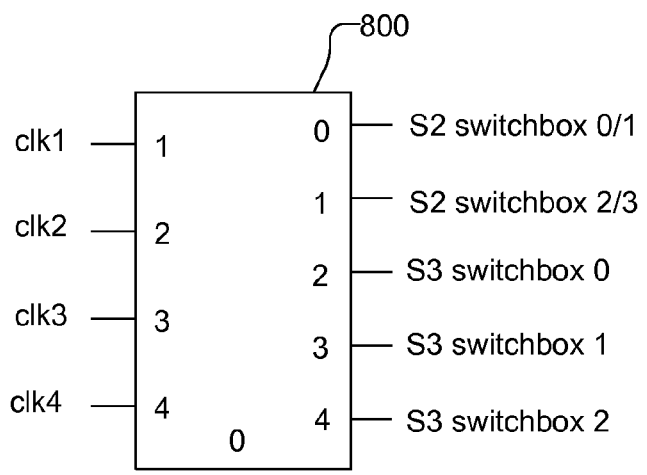
Fig. 8
Fig. 7

LOCAL ROUTING NETWORK WITH SELECTIVE FAST PATHS FOR PROGRAMMABLE LOGIC DEVICE

TECHNICAL FIELD

The present invention relates to programmable logic devices, and more specifically to routing networks used in programmable logic devices.

BACKGROUND

A programmable logic device, sometimes referred to as programmable application specific integrated circuit (PASIC), field programmable gate array (FPGA), or complex programmable logic device (CPLD), is a versatile integrated circuit chip, the internal circuitry of which may be configured by an individual user to realize a user-specific circuit. To configure a programmable logic device, the user configures an on-chip interconnect structure of the programmable logic device so that selected input terminals and selected output terminals of selected on-chip circuit components are electrically connected together in such a way that the resulting circuit is the specific circuit desired by the user.

Programmable logic devices include a number of programmable logic blocks that are interconnected by a programmable routing network, sometimes referred to as an interconnect network.

SUMMARY

A routing network is associated with a logic island in a logic block of a programmable logic device and includes switches for each of feedback, street, and highway networks. Some of the switches include multiple stages. The street network switch receives the signals from the feedback network switch, signals from neighboring highway network switches, and direct feedback from selected logic island outputs and provides outputs to the logic island. The street network switch includes multiple stages, where outputs to the logic island are provided directly by each stage in the street network switch. The output terminals of a first stage of the street network switch that are connected to the logic island are also connected to the second stage of the street network switch. The second stage of the street network switch receives feedback output signals from the feedback network and directly from the associated logic island.

In one implementation, a programmable logic device includes a plurality of logic blocks and an interconnecting network; wherein each logic block in the plurality of logic blocks comprises a logic island and a routing network associated with the logic island, wherein the routing network comprises: a network switch comprising a first stage of switch boxes and a second stage of switch boxes, wherein a first portion of output terminals of the first stage of switch boxes is connected directly to the logic island and is connected directly to a first set of input terminals of the second stage of switch boxes, and a second portion of output terminals of the first stage of switch boxes is connected to a second set of input terminals of the second stage of switch boxes.

In one implementation, a programmable logic device includes a plurality of logic blocks and an interconnecting network; wherein each logic block in the plurality of logic blocks comprises a logic island and a routing network associated with the logic island, wherein the routing network comprises: a network switch comprising a first stage of switch boxes, a second stage of switch boxes connected to the first stage of switch boxes, and a third stage of switch boxes connected to the second stage of switch boxes, wherein a first portion of output terminals of the first stage of switch boxes is connected directly to the logic island, a first portion of output terminals of the second stage of switch boxes is connected directly to the logic island, and output terminals of the third stage of switch boxes is connected directly to the logic island.

In one implementation, a programmable logic device includes a plurality of logic blocks and an interconnecting network; wherein each logic block in the plurality of logic blocks comprises a logic island and a routing network associated with the logic island, wherein the routing network comprises: a feedback network comprising a feedback network switch, the feedback network switch receiving a first set of output signals from the logic island and producing feedback output signals; and a street network comprising a street network switch, the street network switch comprising a first stage of switch boxes and a second stage of switch boxes connected to the first stage of switch boxes, wherein at least one switch box in the second stage of switch boxes has at least one input terminal coupled directly to the feedback network switch to receive the feedback output signals, and at least one switch box in the second stage of switch boxes has at least one input terminal coupled directly to the logic island to directly receive a second set of output signals from the logic island, wherein the set of output signals received by the second stage of switch boxes from the logic island does not pass through the feedback network switch.

BRIEF DESCRIPTION OF THE DRAWINGS

FIG. 7 illustrates the architecture of the look-up tables in the logic cells of the logic island.

FIG. 8 illustrates a clock network switch.

DETAILED DESCRIPTION

Figure 1:
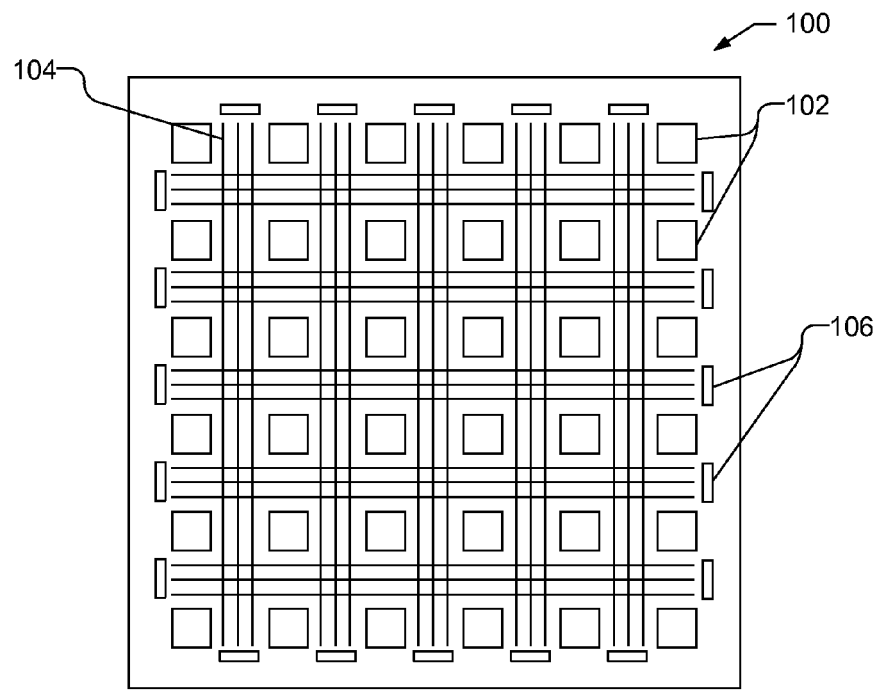
FIG. 1 shows a schematic view of an islanded programmable logic device.

FIG. 1 shows a schematic view of an islanded programmable logic device 100, such as a programmable application specific integrated circuit (PASIC), field programmable gate array (FPGA) or complex programmable logic device (CPLD) or similar devices. Programmable device 100 is illustrated with a number of rows and columns of logic blocks 102 with an interconnecting network 104, e.g., interconnecting wires, shown schematically as horizontal and vertical lines. Each logic block 102 includes one or more logic cells, sometimes referred to herein as logic islands, as well as an associated network switch. The associated network switch may include, e.g., one or more of a street network switch, a feedback network switch, a highway network switch, and a clock network switch, as discussed herein. Programmable device 100 may have more or fewer logic blocks 102 than is illustrated in FIG. 1. A number of input/output ("I/O") cells 106 are also shown in FIG. 1 connected to the interconnecting network 104. The network switches in each logic block 102 may include programmable elements, such as SRAM, EPROM, etc. that may be programmed to interconnect desired logic blocks 102 and I/O cells 106 in various configurations as desired by the user.

Figure 2:
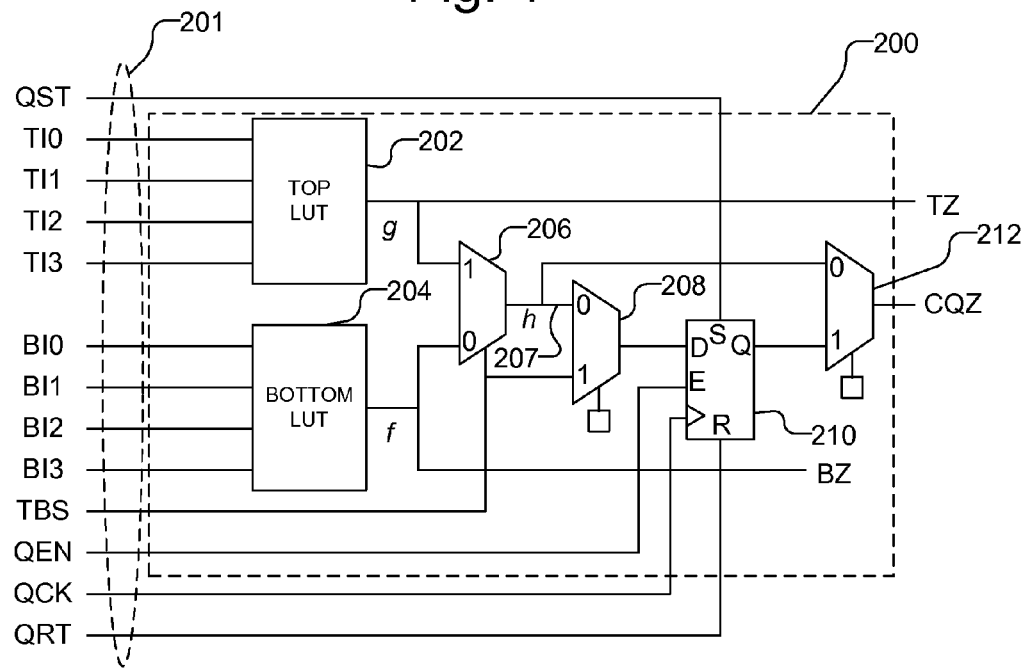
FIG. 2 illustrates an example of a logic cell which may serve as a logic island or as a component of a logic island in a logic block of a programmable logic device.

FIG. 2 illustrates an example of a logic cell 200 which may serve as a logic island within a logic block 102 in the programmable logic device 100, such as that illustrated in FIG. 1. The logic cell 200 is illustrated as including two four-input Look-Up Tables (LUTs) 202 and 204, as well as three two-input multiplexors 206, 208, and 212, and a register 210. The number of LUTs, the number of inputs to the LUTs, as well as the number of inputs to the multiplexors may be altered, if desired. Each LUT 202 and 204 has four input terminals coupled to the routing network 201 at inputs I0, I1, I2, I3 for top LUT 202 and I0, I1, I2, I3 for bottom LUT 204. The output terminal of the top LUT 202 may be provided as output TZ and the output terminal of the bottom LUT 204 may be produced as an output BZ.

The output terminals of the top LUT 202 and bottom LUT 204 are also coupled as inputs to 2×1 multiplexor 206. A select terminal of the multiplexor 206 is coupled to an input TBS. The multiplexor 206 produces a combinatorial logic signal on its output terminal 207. As illustrated, the input TBS is also coupled to an input terminal of the second 2×1 multiplexor 208 along with the output terminal 207 of multiplexor 206. The output terminal of the multiplexor 208 is coupled to the data D input of the register 210. The select terminal of the multiplexor 208 may be fixed, e.g., an SRAM-bit programmed at time of initiation of the programmable logic device to a tie high (VDD) signal or a tie low (GND) signal.

The register 210, illustrated as a D-type flip-flop, has a data D input terminal coupled to the output terminal of multiplexor 208, as well as a clock terminal driven by input QCK. The register 210 may further include a flip-flop enable input terminal E driven by input QEN, set signal input terminal driven by QST and reset signal input terminal driven by QRT. The register 210 includes an output terminal Q that is coupled to a first input terminal of the third 2×1 multiplexor 212. As can be seen, the output terminal 207 of first multiplexor 206 may also be coupled to an input terminal of the third multiplexor 212. The select terminal of the multiplexor 212, thus, selects between the output of the register 210 and the output of the combinatorial logic provided by LUTs 202 and 204 and multiplexor 206. The output terminal of multiplexor 212 may be provided as output CQZ. The select terminal of the multiplexor 212 may be fixed, e.g., an SRAM-bit programmed at time of initiation of the programmable logic device to a tie high (VDD) signal or a tie low (GND) signal.

Figure 3:
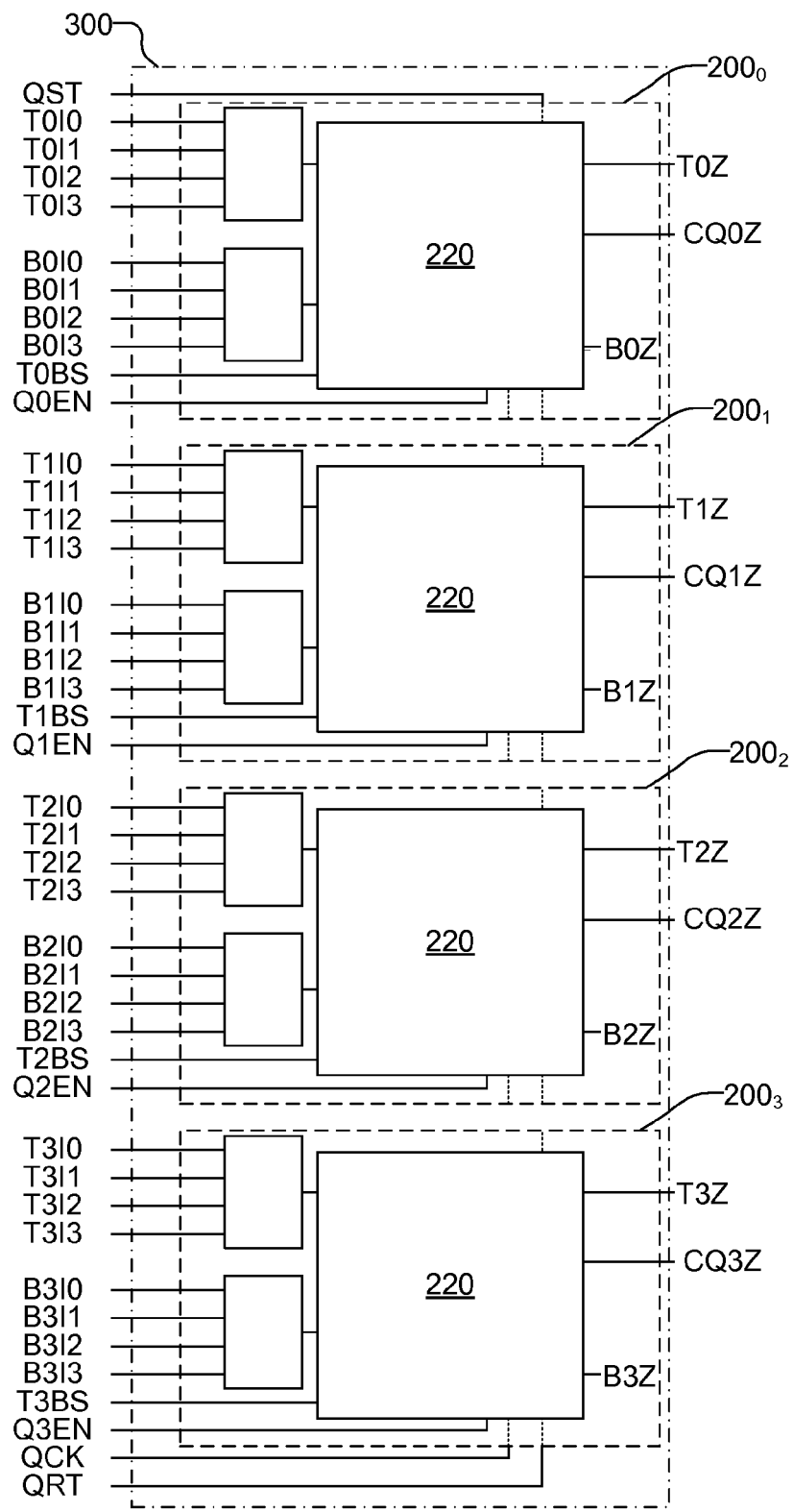
FIG. 3 illustrates a super logic cell, which is a cluster of logic elements, implemented with a plurality of logic cells shown in FIG. 2, which may serve as a logic island of a logic block in a programmable logic device.

FIG. 3 illustrates a super logic cell 300, which is a cluster of logic elements, implemented with a plurality of logic cells 200. Logic cell 200 and super logic cell 300 are described in U.S. Ser. No. 14/476,515, entitled "Logic Cell for Programmable Logic Device," by Vishnu A. Patil et al., filed Sep. 3, 2014, which is incorporated herein by reference in its entirety. The super logic cell 300 may serve as the logic island within a logic block 102 in the programmable logic device 100 shown in FIG. 1. Logic cells 200 may be, but is not necessarily, the same as that illustrated in FIG. 2. Logic cell 200 in FIG. 2, however, is provided merely for illustrative purposes and thus, it should be understood, that the super logic cell 300 may use logic cells other than logic cell 200 shown in FIG. 2. Any desired logic cell may be used with the routing network described herein. By way of example, a logic cell that includes two LUTs 202 and 204 but includes logic that is different than that illustrated in FIG. 2 may be used if desired, and thus, FIG. 3 illustrates the logic of logic cells 200 as boxes 220.

As illustrated in FIG. 3, the super logic cell 300 includes four logic cells $200_0$, $200_1$, $200_2$, and $200_3$ (sometimes collectively referred to as logic cells 200). If desired, more or fewer logic cells may be contained within the super logic cell 300. All four logic cells 200 may share the same clock input QCK, reset input QRT and set input QST from the routing network for their respective registers, as illustrated with dotted lines within the logic cells. Each of the logic cells 200, however, may receive an independent flip-flop enable signals Q0EN, Q1EN, Q2EN, and Q3EN. From the super logic cell 300, eight outputs, namely T0Z, CQ0Z, T1Z, CQ1Z, T2Z, CQ2Z, T3Z and CQ3Z from logic cells $200_0$, $200_1$, $200_2$, and $200_3$, respectively, may be provided to other super logic cells through a routing network. A number of outputs, e.g., B0Z, B1Z, B2Z and B3Z from logic cells $200_0$, $200_1$, $200_2$, and $200_3$, respectively, however, may not be provided to other super logic cells through the routing network, but may be used if and when required during logical path formation, to feed back to the same super logic cell 300, e.g., through a dedicated feedback network. If desired, all outputs, e.g., T0Z, CQ0Z, T1Z, CQ1Z, T2Z, CQ2Z, T3Z and CQ3Z from logic cells $200_0$, $200_1$, $200_2$, and $200_3$, respectively, may also be used as feed back to the same super logic cell 300, e.g., through the dedicated feedback network, not shown.

Figure 4:
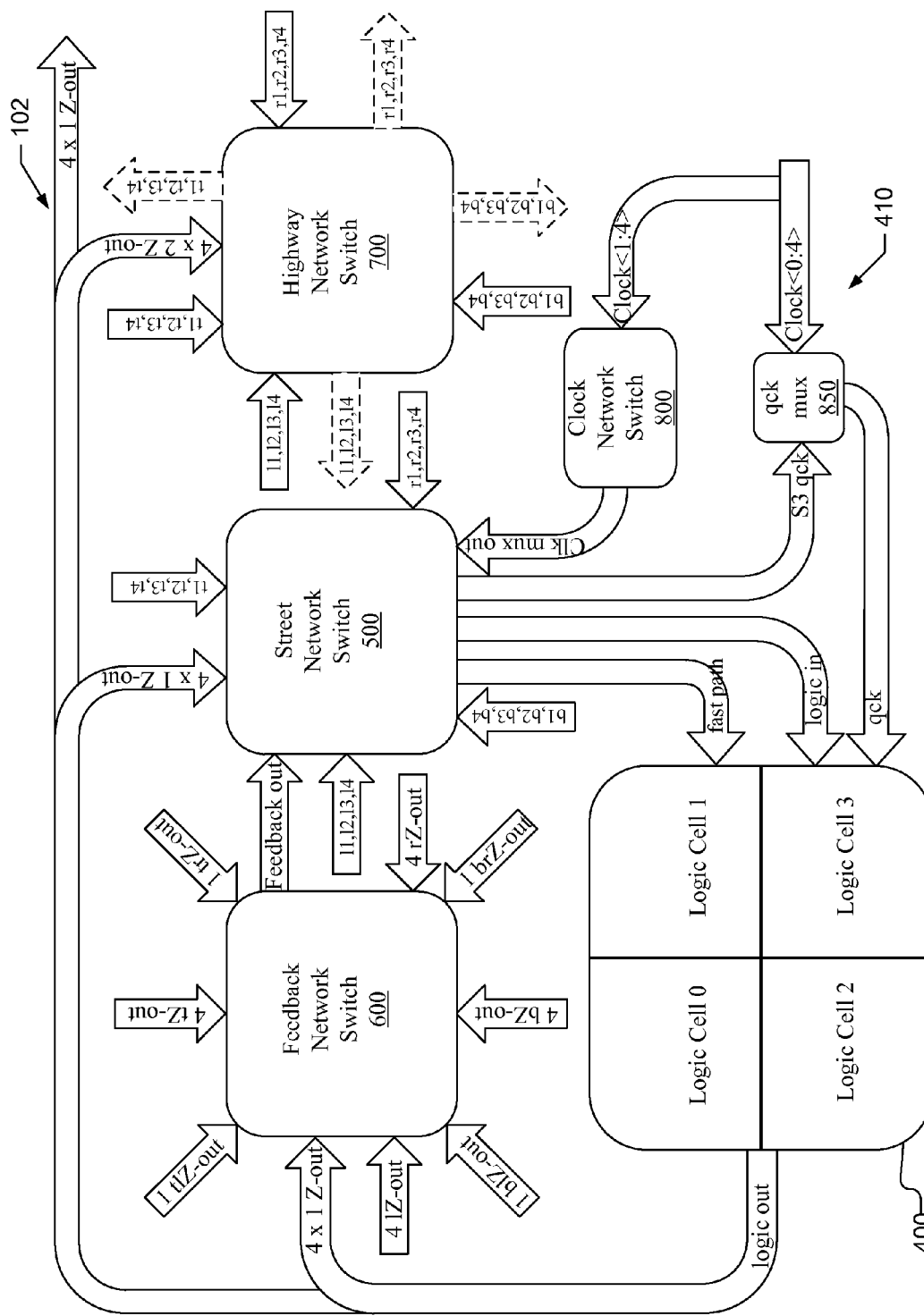
FIG. 4 is a block diagram illustrating a logic block with a logic island and associated routing network including a street network switch, a feedback network switch, a highway network switch, and a clock network switch.

FIG. 4 is a block diagram illustrating an embodiment of the logic block 102 in the programmable logic device 100 shown in FIG. 1. The logic block 102 is illustrated as including a logic island 400, which may include a plurality of logic cells, labeled logic cell 0, logic cell 1, logic cell 2, and logic cell 3, and may be implemented as the super logic cell 300 in FIG. 3. As will be understood by those of ordinary skill in the art in light of the present disclosure, the logic island 400 is not limited to the specific configuration illustrated in super logic cell 300 in FIG. 3 and may be implemented with other logic cell configurations including additional or fewer logic cells. The logic block 102 is further illustrated as including a routing network 410 that may include, e.g., one or more network switches selected from a group including a street network switch 500, a feedback network switch 600, a highway network switch 700, a clock network switch 800, and a mux 850, referred to as qck mux 850, and the accompanying routing resources, e.g., wires and programmable elements, such as SRAMs, EPROMs, etc., that may be programmed to interconnect desired logic blocks 102 and I/O cells 106 in various configurations as desired by the user. As the logic island 400 and the street network switch 500, feedback network switch 600, highway network switch 700, and clock network switch 800 are within the same logic block 102, the various network switches 500, 600, 700, and 800 are sometimes referred to as being associated with the logic island 400 and vice versa. The programmable logic device 100 shown in FIG. 1 may be implemented with an array of logic blocks 102, including logic island 400 and associated routing network 410, such that each logic block 102 has at least four neighboring logic blocks to the top (t), bottom (b), left (l) and right (r). The logic block 102 may be said to further include neighboring logic blocks along the diagonals directions, e.g., at the left-top (lt), the left-bottom (lb), the right-top (rt), and right bottom (rb). Of course, if the logic block 102 is located at a side or corner of the programmable logic device 100, there are fewer neighboring logic blocks. It should be understood that the routing network 410 (including one or more of the street network switch 500, feedback network switch 600, highway network switch 700 and clock network switch 800) is associated with the logic island 400 in the logic block 102, and thus, neighboring logic blocks or components of neighboring logic blocks may be referenced to the routing network 410 (or the included one or more of the street network switch 500, feedback network switch 600, highway network switch 700 and clock network switch 800) or the associated logic island 400 interchangeably.

As illustrated in FIG. 4, the logic island 400 receives input data (logic in) and (fast path) from the street network switch 500 and produces output data (logic out) to the feedback network switch 600, the street network switch 500, and the highway network switch 700. The logic island 400 additionally received a clock signal qck via the qck mux 850. The output data (logic out) of the logic island 400 is sometimes collectively referred to as Z-out, and by way of example, may be the TZ, BZ, and CQZ outputs from each logic cell of a super logic cell if the logic cell from FIGS. 2 and 3 is used.

The qck mux 850, e.g., may be a 6:1 mux, that receives five clock signals (Clock<0:4>, as well as a sixth input S3 qck from the street network switch 500, e.g., which may be an output from the third stage of switches (S3). As illustrated, the clock network switch 800 may receive a subset of the clock signals, e.g., Clock<1:4>.

The feedback network switch 600 may receive at least a portion of the output data (logic out) from the logic island 400. For example, as illustrated in FIG. 4, the feedback network switch 600 may receive 4×1 Z-out signals from the logic island 400, i.e., the feedback network switch 600 may receive the outputs BZ from each of the four logic cells (if logic cells 200 shown in FIG. 2 are used) of the logic island 400. If desired, the feedback network switch 600 may receive more or fewer outputs, e.g., TZ, BZ, and CQZ from each of the four logic cells (if logic cells 200 shown in FIG. 2 are used) of the logic island 400. Additionally, the feedback network switch 600 may receive at least a portion of the Z-out signals from logic islands in immediately neighboring logic blocks, e.g., to the immediate left (l), right (r), top (t) and bottom (b) of the logic block 102. By way of example, the feedback network switch 600 may receive Z-out signals from the four logic cells in a logic island to the immediate left (e.g., 4 lZ-out), Z-out signals from the four logic cells in a logic island to the immediate right (e.g., 4 rZ-out), Z-out signals from the four logic cells in a logic island to the immediate top (e.g., 4 tZ-out), and Z-out signals from the four logic cells in a logic island to the immediate bottom (e.g., 4 bZ-out). If desired, the Z-out signals received from logic islands in immediately neighboring logic blocks may be, e.g., the CQZ outputs and/or the TZ outputs (if logic cells 200 shown in FIG. 2 are used) from the neighboring logic islands.

Additionally, the feedback network switch 600 may receive Z-out signals from additional neighboring logic islands, e.g., four additional logic islands in logic blocks located diagonally with respect to the logic block 102. Thus, feedback network switch 600 may receive Z-out signals from a total of eight neighboring logic blocks. For example, the feedback network switch 600 may additionally receive Z-out signals from the diagonally neighboring logic blocks, including a Z-out signal from the four logic cells in a logic island to the immediate left-top (e.g., 1 ltZ-out), a Z-out signal from the four logic cells in a logic island to the immediate right-top (e.g., 1 rtZ-out), a Z-out signal from the four logic cells in a logic island to the immediate left-bottom (1 lbZ-out), and a Z-out signal from the four logic cells in a logic island to the immediate right-bottom (e.g., 1 rbZ-out). If desired, more than one Z-out signal may be received from each logic islands in immediately diagonally neighboring logic blocks and the Z-out signals may be, e.g., the CQZ outputs and/or the TZ outputs (if logic cells 200 shown in FIG. 2 are used) from the diagonally neighboring logic islands.

Thus, in one implementation, the feedback network switch 600 receives a first type of Z-out signal, e.g., outputs BZ, from the local logic island 400, i.e., the logic island 400 associated with the feedback network switch 600, and the feedback network switch 600 receives a different type of Z-out signal, e.g., outputs CQZ, from the eight neighboring logic cells, e.g., neighboring logic islands in logic blocks to the sides and diagonals of the feedback network switch 600.

The feedback network switch 600 provides its output (feedback out) to the street network switch 500. The street network switch 500 also may receive at least a portion of the output data (logic out) from the logic island 400. For example, as illustrated in FIG. 4, the street network switch 500 may receive 4×1 Z-out signals from the logic island 400, e.g., the street network switch 500 may receive the outputs CQZ from each of the four logic cells (if logic cells 200 shown in FIG. 2 are used) of the logic island 400 associated with the street network switch 500. If desired, the street network switch 500 may receive more or fewer outputs, e.g., TZ, BZ, and CQZ from each of the four logic cells (if logic cells 200 shown in FIG. 2 are used) of the logic island 400.

The street network switch 500 may also receive clock signals from the clock network switch 800. The street network switch 500 also receives signals from a plurality of neighboring highway network switches, i.e., highway network switches in a plurality (i) of neighboring logic blocks in each direction, e.g., to the left (l), right (r), top (t) and bottom (b) with respect to the street network switch 500. For example, in one implementation, i=4, and thus, the street network switch 500 may receive signals from four neighboring highway network switches to the left li (i=1, 2, 3, 4), right ri (i=1, 2, 3, 4), top ti (i=1, 2, 3, 4), and bottom bi (i=1, 2, 3, 4). Thus, as illustrated in FIG. 4, the street network switch 500 may receive signals from the highway network switches associated with four neighboring logic blocks to the left (l1, l2, l3, l4), the highway network switches associated with four neighboring logic blocks to the right (r1, r2, r3, r4), the highway network switches associated with four neighboring logic blocks to the top (t1, t2, t3, t4), and the highway network switches associated with four neighboring logic blocks to the bottom (b1, b2, b3, b4). The street network switch 500 may output at least a portion of the received signals, including the data from the feedback network switch 600, a portion of Z-out signals from the associated logic island 400 (as direct feedback input), the data from the highway network switches associated with neighboring logic blocks, and the clock signals from the clock network switch 800, to the associated logic island 400 as input data (logic in). Additionally, the street network switch 500 may output at least a portion of the received signals to the associated logic island 400 along a fast path that is separate from input data (logic in). The fast path provides data to the associated logic island 400 from, e.g., a first stage in the street network switch 500 that includes a plurality of stages, as discussed below in FIG. 6.

Moreover, if desired, the street network switch 500 may additionally receive signals from a plurality of neighboring highway network switches in the diagonal directions with respect to logic block 102. For example, the street network switch 500 may receive signals from a plurality j of highway network switches in eight directions, including the left (l), right (r), top (t) and bottom (b), as well as the left-top (lt), right-top (rt), left-bottom (lb) and right-bottom (rb), where j may be the same or different than i. Thus, where j=4, street network switch 500 may receive additional signals from, e.g., the highway network switches associated with four neighboring logic blocks to the left-top (lt1, lt2, lt3, lt4), the highway network switches associated with four neighboring logic blocks to the right-top (rt1, rt2, rt3, rt4), the highway network switches associated with four neighboring logic blocks to the left-bottom (lb1, lb2, lb3, lb4), and the highway network switches associated with four neighboring logic blocks to the right-bottom (rb1, rb2, rb3, rb4).

The highway network switch 700 may also receive at least a portion of the output data (logic out) from the logic island 400. For example, as illustrated, the highway network switch 700 may receive 4×2 Z-out, as it may receive any of the two outputs from each of the four logic cells of the logic island 400 through local routing wires, e.g., the TZ outputs and the CQZ outputs from the four logic cells (if logic cells 200 shown in FIG. 2 are used) of the logic island 400 associated with the highway network switch 700. Additionally, the highway network switch 700 may also receive signals from a plurality of neighboring highway network switches, i.e., highway network switches in a plurality (i) of neighboring logic blocks in each direction, e.g., to the left (l), right (r), top (t) and bottom (b) with respect to the highway network switch 700 through the highway interconnect wires, e.g., interconnecting network 104 in FIG. 1. For example, in one implementation, i=4, and thus, the highway network switch 700 may receive signals from up to four neighboring highway network switches to the left li (i=1, 2, 3, 4), right ri (i=1, 2, 3, 4), top ti (i=1, 2, 3, 4), and bottom bi (i=1, 2, 3, 4). Thus, as illustrated in FIG. 4, the highway network switch 700 may receive signals from the highway network switches associated with four neighboring logic blocks to the left (l1, l2, l3, l4), the highway network switches associated with four neighboring logic blocks to the right (r1, r2, r3, r4), the highway network switches associated with four neighboring logic blocks to the top (t1, t2, t3, t4), and the highway network switches associated with four neighboring logic blocks to the bottom (b1, b2, b3, b4). The highway network switch 700 may provide the received signals, including the data from the logic island 400 and the data from neighboring highway network switches as output signals to street network switches and highway network switches in neighboring logic blocks in each direction via highway interconnect wires, e.g., i neighboring logic blocks to the left (l), right (r), top (t) and bottom (b) with respect to the highway network switch 700, where in one implementation i=4. Thus, as illustrated by the arrows with dashed lines pointing away from highway network switch 700, output data is provided to the street network switches and highway network switches in four neighboring logic blocks to the left (l1, l2, l3, l4), in four neighboring logic blocks to the right (r1, r2, r3, r4), in four neighboring logic blocks to the top (t1, t2, t3, t4), and in four neighboring logic blocks to the bottom (b1, b2, b3, b4).

Figure 4A:
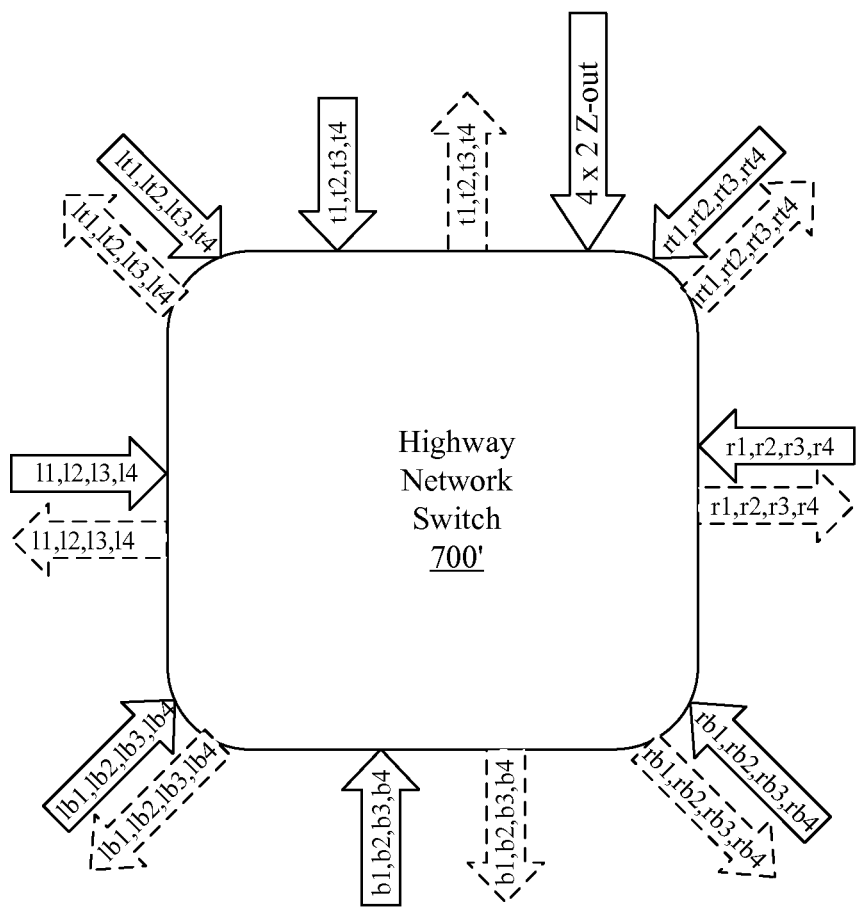
FIG. 4A illustrates an embodiment of the highway network switch from FIG. 4.

Moreover, if desired, the highway network switch 700 may additionally receive signals from and output signals to a plurality of neighboring highway network switches in the diagonal directions with respect to logic block 102. For example, FIG. 4A illustrates a highway network switch 700' that is similar to and may be used in place of highway network switch 700 and that receives signals from and outputs signals to a plurality j of highway network switches in eight directions, including the left (l), right (r), top (t) and bottom (b), as well as the left-top (lt), right-top (rt), left-bottom (lb) and right-bottom (rb), where j may be the same or different than i. Thus, where j=4, highway network switch 700' receives additional signals from and provides signals to (as illustrated with solid arrows and arrows with dashed lines) the highway network switches associated with four neighboring logic blocks to the left-top (lt1, lt2, lt3, lt4), the highway network switches associated with four neighboring logic blocks to the right-top (rt1, rt2, rt3, rt4), the highway network switches associated with four neighboring logic blocks to the left-bottom (lb1, lb2, lb3, lb4), and the highway network switches associated with four neighboring logic blocks to the right-bottom (rb1, rb2, rb3, rb4).

The clock network switch 800 illustrated in FIG. 4 may receive dedicated clock signals or high fan out signals Clock <1:4> as inputs and provides outputs (clk mux out) to the street network switch 500.

Figure 5:
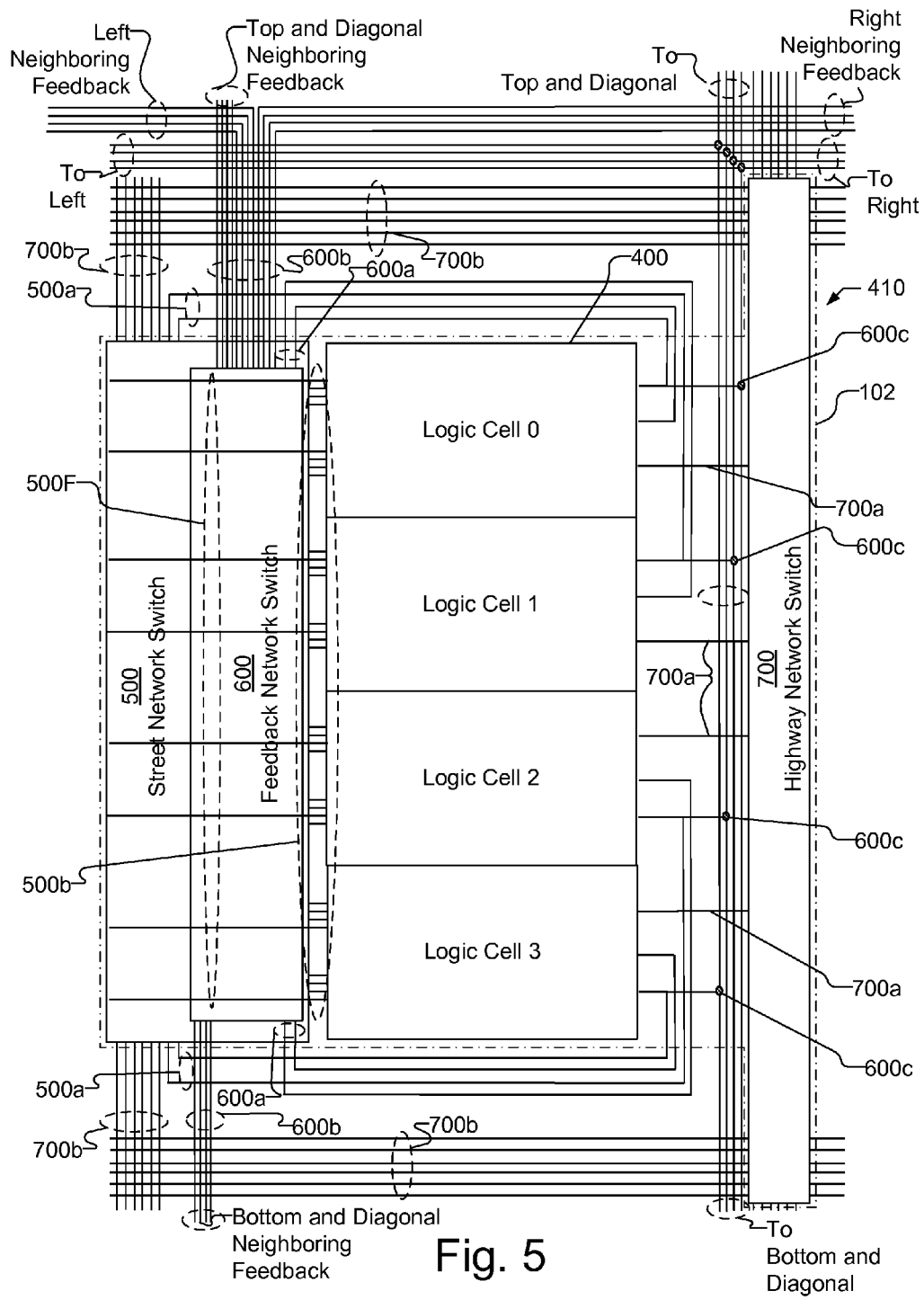
FIG. 5 illustrates a logic block with a logic island and associated routing network.

FIG. 5, by way of example, illustrates a logic block 102 including a logic island 400 (which may be implemented as the super logic cell 300 from FIG. 3) and the routing network 410, including the street network switch 500, the feedback network switch 600, and the highway network switch 700, as well as routing resources including wires and programmable elements. It should be understood that only a portion of the routing resources are illustrated in FIG. 5 in order to avoid unduly complicating the figure, but one of ordinary skill in the art may implement the routing recourses to the various network switches and associated logic island in the logic block 102 and to other logic blocks in light of the present disclosure. FIG. 5 illustrates street network resources 500a are coupled to the street network switch 500, where street network resources 500a are routing wires from the associated logic island outputs. Additionally, street network resources 500b and 500F are coupled to the street network switch 500, where street network resources 500b provide inputs to the associated logic island 400 and street network resources 500F provide fast path inputs from the first stage in the street network switch 500 to the associated logic island 400.

Feedback network resources 600a and 600b are coupled to the feedback network switch 600, where feedback network resources 600a are routing wires from the associated logic island outputs and feedback network resources 600b are routing wires from neighboring logic blocks, including diagonally neighboring logic blocks. Feedback network resources 600c are routing wires provided to neighboring logic blocks, including diagonally neighboring logic blocks and are also provided as street network resources 500a.

Highway network resources 700a and 700b are coupled to the highway network switch 700, where highway network resources 700a are routing wires coupled to the associated logic island outputs, and highway network resources 700b are routing wires from neighboring logic blocks, which are also coupled to the street network switch 500. As can be seen, some of the highway network resources 700a from the associated logic island outputs are provided to left, right, top and bottom neighboring logic blocks.

Thus, as illustrated logic island 400 provides output signals to the street network resources 500a, the feedback network resources 600a, 600c and the highway network resources 700a and the street network resources 500b and 500F provide inputs to the associated logic island 400. It can be seen that the feedback network resources 600b receive signals from the left, right, top and bottom and diagonally neighboring logic blocks, and the highway networks resources 700b receive signals from the left, right, top and bottom neighboring logic blocks. Additionally, the highway network switch 700 provides signals to left, right, top and bottom neighboring logic blocks.

Figure 6:
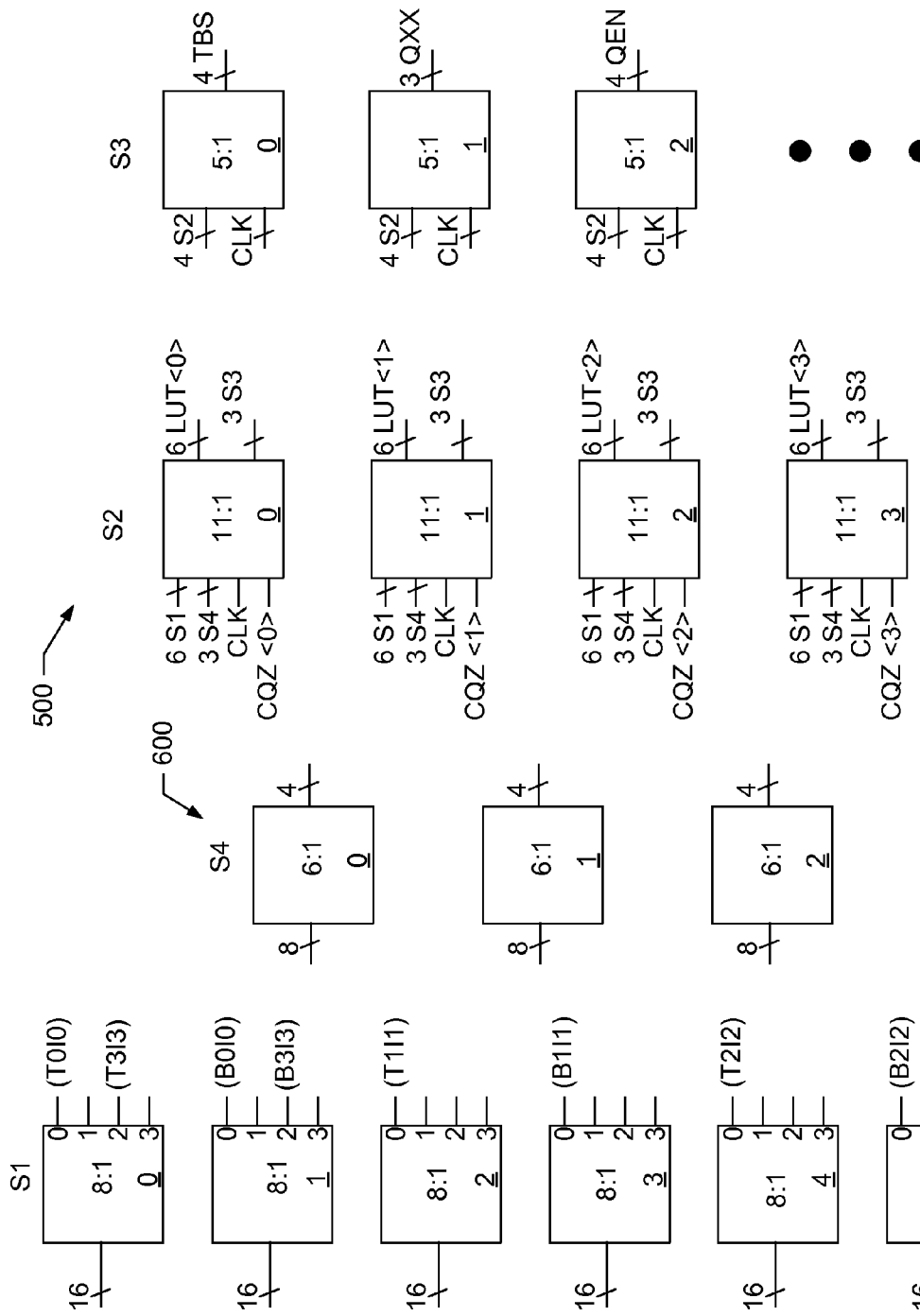
FIG. 6 illustrates the architecture of the street network switch and feedback network switch.

FIG. 6 illustrates the architecture of the street network switch 500, which includes multiple stages including S1, S2, and S3, and feedback network switch 600, shown as stage S4. The street network switch 500 includes a number of stages of switchboxes for different types of signals.

The street network switch 500 is a Probabilistic Multi-stage Circuit Switching Network (PMCSN), which structurally differs from a conventional multi-stage non-blocking communication network topologies, such as a Clos network, as the street network switch 500 ensures just enough number of cross-points to meet a probabilistic goal in terms of possible number of paths through the stages for the class of circuits at interest. In a staged network system with a traditional multi-stage non-blocking communication network topologies, an input signal can reach an output without blocking any other signals. Thus, the reaching probability of any input signal to the output is 1. In PMCSN, on the other hand, while there are provisions for realizing any input at the outputs, there may be situations of simultaneous output demands of multiple input signals, and thus, blocking of one or more input signals is unavoidable in order to pass another input signal. The design of PMCSN emphasizes the non-blocking of signals that are determined to be higher in demand while signals that are lower in demand may be blocked. Consequently, probabilistically high demand signals will most likely be unblocked in PMCSN, which is why the street network switch 500 is probabilistic in nature.

As illustrated in FIG. 6, each stage of the street network switch 500 may contain a plurality of switch boxes. For example, stage S1 may contain six switch boxes, labeled 0-5, wherein each switch box in stage S1 may have 16 input terminals and 4 output terminals (labeled 0-3). Thus, stage S1 may receive input signals from the highway network switches associated with a plurality of neighboring logic blocks to the left, right, top, bottom of the street network switch 500. For example, stage S1 may receive signals from each of the four immediately neighboring highway network switches in each of the left, right, top, and bottom directions. Each of the highway network switches may provide, e.g., six signals in each direction. Thus, stage S1 may receive 24 input signals from each direction, thus resulting in 96 input signals to stage S1 of the street network switch 500. Of course, if desired, a different number of signals from each highway network switches, as well as a different number of highway network switches in each direction, may be used.

Additionally, as illustrated in FIG. 6, a number, e.g., 8, of the output terminals of stage S1 directly connect to specific inputs of the associated logic island. By way of example, terminals 0 and 2 of switch box 0 of stage S1 are connected to terminals T0I0 and T3I3 of the associated logic island. Similarly, terminals 0 and 2 of switch box 1 are connected to terminals B0I0 and B3I3 of the associated logic island, terminals 0 of switch boxes 2, 3, 4, and 5, are respectively connected to terminals T1I1, B1I1, T2I2, and B2I2. FIG. 7, by way of illustration, shows the architecture of the look-up tables that may be present in the associated logic island, illustrating a top (T) and bottom (B) LUT for each logic cell (0, 1, 2, and 3), and illustrates the input terminal directly connected to the first stage S1 of the street network switch 500, e.g., fast path connection, with an F. If desired, different output terminals of stage S1 may be connected to different input terminals of the associated logic island. Moreover, a different number of output terminals, i.e., additional or fewer output terminals, of stage S1 may be connected to the input terminals of the associated logic island. The remaining connections, i.e., the non-fast path connections, from stage S1 to the associated logic island must travel through a number of stages, e.g., through stage S2 or through stages S2 and S3, and therefore are subject to stage delays that are significantly greater than any delays in the direct connections. Accordingly, the direct connection of the output terminals of stage S1 to the associated logic island is sometimes referred to herein as a "fast path," as the direct connection is relatively faster compared to the non-direct connections which must pass through the additional stages in the network switch. In addition, one or more of the output terminals of stage 1 that are directly connected to the associated logic island also are connected to the input terminals of stage S2 of the street network switch 500, e.g., to provide a back-up path to reach to other inputs of the logic cells in the logic island. In one implementation, all of the output terminals of stage 1 along the fast path are also connected to the input terminals of stage S2. Accordingly, the signals selected for the fast path will not completely lose direction flexibility and at the same time can be used for faster connections with the capability of bypassing the intermediate stages in the street network switch 500. For example, timing critical paths may be directed on to fast paths based upon the availability by the synthesizer and/or timing optimizer.

At least one switch box in stage S1 of the street network switch 500 includes at least one output terminal that does not have full access to all of the input terminals in that switch box. In one implementation, in each switch box 0-5 of stage S1, each output terminal 0-3 has access to less than all of the input terminals 0-15, e.g., half of the input terminals. For example, as indicated by "8:1" in each switch box in stage S1, each output terminal may have access to 8 of the 16 input terminals, e.g., via an 8×1 multiplexor, or other equivalent circuits, e.g., a 8×1 multiplexor may be replaced with a 7×1 multiplexor and a 2×1 multiplexor. Different output terminals in each switch box may have access to a different subset of the input terminals. Moreover, if desired, other sizes of proper subsets of the input terminals may be used and different output terminals may have access to a different number of input terminals. The specific input terminal that may be accessed by each output terminal may be programmed at time of initiation of the programmable logic device.

As illustrated in FIG. 6, the second stage S2 in the street network switch 500 also contains a plurality of switch boxes. By way of example, stage S2 is illustrated as contains 4 switch boxes (labeled 0-3), each having 11 input terminals and 9 output terminals. By way of example, 6 input terminals of each switch box in stage S2 are coupled to output terminals of switch boxes 0-5 in stage S1, some or all of which may be fast path terminals, i.e., also directly connected to the associated logic island. The switch boxes 0-3 in stage S2 each additionally includes a number of input terminals that are connected to a portion of the output terminals from stage S4 in the feedback network switch 600. By way of example, switch boxes 0-3 may each have three input terminals that are connected to output terminals from stage S4. Additionally, clock signals may be received by an input terminal of each switch box in the second stage S2. For example, as illustrated, the switch boxes 0-3 in stage S2 may each additionally include an input terminal that is connected to a portion of the output terminals from the clock network switch 800, shown in FIG. 8. Further, output signals from each logic cell in the associated logic island may be directly received by input terminals of the switch boxes in the second stage S2. For example, the switch boxes 0-3 in stage S2 may each additionally include an input terminal that is directly connected to receive CQZ<0>-CQZ<3> from the logic cells 0-3 in the associated logic island.

Each switch box 0-3 in stage S2 may include a number of, e.g., 9, output terminals. A portion of the output terminals of each switch box 0-3 in stage S2 is connected directly to the input terminals of the switch boxes in the third stage S3. For example, 3 output terminals (labeled 3 S3) of each switch box 0-3 may be connected directly to the input terminals of the switch boxes in the third stage S3. The remaining portion of output terminals of each switch box 0-3 in stage S2, e.g., 6 output terminals of each switch box, may be connected directly to the logic island 400. By way of example, the output terminals from each switch box in second stage S2 that are connected directly to the logic island 400 may be connected to the input terminals of the LUTs in each logic cell, e.g., switch box 0 may have 6 output terminals directly connected to 6 LUT<0> inputs, switch box 1 may have 6 output terminals directly connected to 6 LUT<1> inputs, switch box 2 may have 6 output terminals directly connected to 6 LUT<2> inputs, and switch box 3 may have 6 output terminals directly connected to 6 LUT<3> inputs.

In one implementation, each output terminal has access to all of input terminals in each switch box in stage S2. For example, as indicated by "11:1" in each switch box in stage S2 in FIG. 6, each output terminal may have access to all 11 input terminals, e.g., via an 11×1 multiplexor, or other equivalent circuits, e.g., a 11×1 multiplexor may be replaced with a 10×1 multiplexor and a 2×1 multiplexor. If desired, however, different output terminals in each switch box in stage S2 may have access to a different number of the input terminals. For example, each of the output terminals in switch boxes 0-3 of stage S2 that are connected directly to the input terminals of the switch boxes in the third stage S3, may have access to less than all of the input terminals, e.g., they may access all of the input terminals connected to stage S1 and stage S4 (the feedback network switch 600). Further, some of the output terminals in switch boxes 0-3 of stage S2 may have access to a tie high (VDD) signal or a tie low (GND) signal and/or the clock signal on the CLK input terminal. For example, some of the output terminals in switch boxes 0-3 of stage S2 that are connected directly to the LUTs in the associated logic island, may access all of the input terminals connected to stage S1 and stage S4 as well as tie low (GND) signal, while other output terminals may access all of the input terminals connected to stage S1 and stage S4, the tie low (GND) signal, as well as either the CLK input terminal or the tie high (VDD) signal. If desired, other sizes of subsets of the input terminals may be used and different output terminals may have access to a different number of input terminals. The specific input terminal that may be accessed by each output terminal may be programmed at time of initiation of the programmable logic device.

The third stage S3 in the street network switch 500 also contains a plurality of switch boxes. By way of example, stage S3 is illustrated as containing 3 switch boxes (labeled 0-2), each having, e.g., 5 input terminals that are connected to 4 output terminals from the switch boxes 0-3 in stage S2 and the CLK signal. For example, as illustrated, the switch boxes 0-3 in stage S3 may each additionally include an input terminal that is connected to a portion of the output terminals from the clock network switch 800, shown in FIG. 8.

The switch boxes 0-2 in stage S3 may have a number of output terminals, e.g., each switch box 0 and 2 in stage S3 is illustrated as having 4 output terminals and switch box 1 is illustrated with 3 output terminals. The output terminals from stage S3 are connected directly to the logic island 400, e.g., the different switch boxes in stage S3 may be coupled to different input terminals of the logic cells in the associated logic island. For example, the output terminals of switch box 0 in stage 3 may be received by the TBS input terminals in the logic cells, the output terminals of switch box 1 in stage 3 may be received by the QXX, i.e., any of the "Q" input terminals in the logic cells, and the output terminals of switch box 2 in stage 3 may be received by the QEN input terminals in the logic cells. As indicated by dots 502 in FIG. 6, if desired stage S3 may include one or more additional switchboxes. For example, if the logic cells in the associated logic island include additional input terminals than what is shown in FIG. 2, one or more additional switchboxes in stage S3 may be used to provide output terminals that are coupled to the additional input terminals, where stage S2 would include a different number of output terminals to accommodate the additional switchboxes in stage S3.

In one implementation, each output terminal of each switch box in stage S3 may have access to all input terminals. For example, as indicated by "5:1" in each switch box in stage S3 in FIG. 6, each output terminal may have access to all 5 input terminals, e.g., via a 5×1 multiplexor, or other equivalent circuits, e.g., a 5×1 multiplexor may be replaced with a 4×1 multiplexor and a 2×1 multiplexor. If desired, however, different output terminals in each switch box in stage S3 may have access to a different number of the input terminals. For example, some switch boxes in stage S3 may have access to the 4 input terminals that are connected to stage S2 in addition to a tie low (GND) signal, while other output terminals may have access to the 4 input terminals that are connected to stage S2 in addition to a tie low (GND) signal and the CLK input terminal, while other output terminals may have access to the 4 input terminals that are connected to stage S2 in addition to a tie low (GND) signal, the CLK input terminal, and the tie high (VDD) signal. If desired, other sizes of subsets of the input terminals may be used and different output terminals may have access to a different number of input terminals. The specific input terminal that may be accessed by each output terminal may be programmed at time of initiation of the programmable logic device.

The feedback network switch 600 is illustrated as a single stage S4 that includes a number of switch boxes in FIG. 6. As illustrated, the stage S4 may include 3 switch boxes (labeled 0-2), each having, e.g., 8 input terminals, for a total of 24 input terminals in stage S4. By way of example, four of the input terminals in the feedback network switch 600 may be directly connected to receive output signals, e.g., BZ, from each logic cell in the associated logic island. The remaining input terminals in the feedback network switch 600 may be directly connected to receive output signals from logic cells in neighboring logic blocks. For example, 16 input terminals in the feedback network switch 600 may be directly connected to receive output signals, e.g., CQZ, from four logic cells in the neighboring top, bottom, left, and right logic blocks, and 4 input terminals in the feedback network switch 600 may be directly connected to receive output signals, e.g., CQZ, from one logic cell in the four diagonally neighboring logic blocks.

Each switch box in stage S4 in the feedback network switch 600 may have four output terminals that are directly connected to input terminals of the switch boxes in stage S2 of the street network switch 500, as discussed above. In one implementation, each output terminal has access to less than all of the input terminals in each switch box in stage S4. For example, as indicated by "6:1" in each switch box in stage S4, each output terminal may have access to 6 out of the 8 input terminals, e.g., via a 6×1 multiplexor, or other equivalent circuits, e.g., a 6×1 multiplexor may be replaced with a 5×1 multiplexor and a 2×1 multiplexor. If desired, however, different output terminals in each switch box in stage S4 may have access to a different number of the input terminals. Moreover, if desired, other sizes of subsets of the input terminals may be used and different output terminals may have access to a different number of input terminals. The specific input terminal that may be accessed by each output terminal may be programmed at time of initiation of the programmable logic device.

FIG. 7, as discussed above, shows the architecture of the look-up tables that may be present in the associated logic island, illustrating a top (T) and bottom (B) LUT for each logic cell (0, 1, 2, and 3). At least one input terminal of each LUT may be directly connected to the first stage S1 of the street network switch 500, e.g., via the fast path as indicated in FIG. 7 with an "F." In one implementation, the fast path connection from stage S1 of the street network switch 600 is connected to a different pin number for each logic cell, e.g., the fast path is connected to input terminal 0 of the LUTs T0 and B0 of logic cell 0, the fast path is connected to input terminal 1 of the LUTs T1 and B1 of logic cell 1, the fast path is connected to input terminal 2 of the LUTs T2 and B2 of logic cell 2, and the fast path is connected to input terminal 3 of the LUTs T3 and B3 of logic cell 3. The remaining input terminals of the LUTs may be connected to output terminals of stage S2 of the street network switch 500, shown in FIG. 6.

FIG. 8 illustrates a clock network switch 800 that permits distribution of dedicated clock signals and/or high fan out signals to different inputs to the logic island. As illustrated, the clock network switch 800 may include 4 input terminals (labeled 1-4), which receive clock signals (clk1, clk2, clk3, and clk4). The clock network switch 800 further includes 5 output terminals labeled 0-4. Of course a different number of clock inputs or outputs may be used if desired. Each output terminal has full access to the input terminals of the clock network switch, e.g., via a 4×1 multiplexor. By providing clock signals to stages S2 and S3 in the street network switch 500, which may be provided directly to input terminals of the logic island 400, the logic island 400 has access to dedicated clock signals, timing critical signals, or high fan out signals with better timing.

Figure 9:
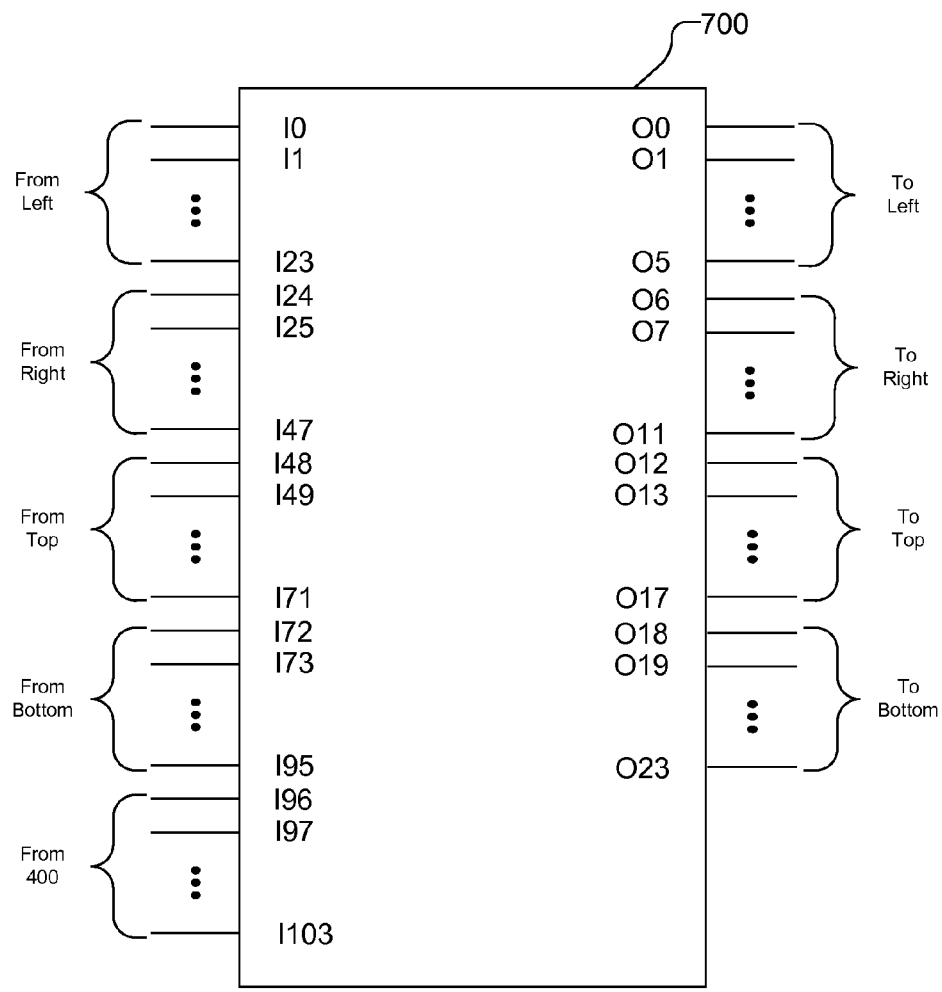
FIG. 9 illustrates the architecture of the highway network switch.
Figure 10:
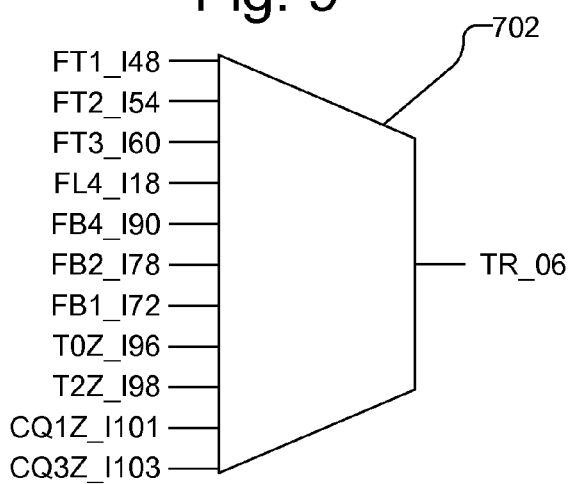
FIG. 10 illustrates a multiplexor that may be used in the highway network switch.

FIGS. 9 and 10 illustrate in combination, the architecture of the highway network switch 700. As illustrated in FIG. 9, the highway network switch 700 may be a single stage switch and may receive input signals from the highway network switches associated with a plurality of neighboring logic blocks to the left, right, top and bottom of the highway network switch 700, as well as diagonal directions if desired. For example, the highway network switch 700 may receive six input signals from four highway network switches, for a total of 24 inputs from the left I0I23), from the right I24I47), from the top I48I71), and from the bottom I72I95). The highway network switch 700 may additionally receive input signals from the associated logic island 400, e.g., two input signals from each of four logic cells of associated logic island 400 for a total of 8 input signals I96I103). The highway network switch may produce six output signals in each direction, e.g., to the left (O0-O5), to the right (O6-O11), to the top (O12-O17) and to the bottom (O18-O23) for a total of 24 outputs, as well as signals in the diagonal directions if desired. In each direction, six M×1 multiplexors are used, where out of the M inputs to each multiplexor, "p" inputs come from the neighboring highway network switches and q inputs are from the associated logic island 400. FIG. 10, by way of example, illustrates an example of an 11×1 multiplexor 702, e.g., where M=11, that may be used in the highway network switch 700. In this non-limiting example, p=7, i.e., 7 inputs are from neighboring highway network switches, and q=4, wherein 4 inputs are from the associated logic island 400. In this example, the multiplexors receives 11 inputs consisting of three signals (FTY_IXX) from the top, three from the bottom (FBY_IXX), one from the left (FLY_IXX) and four from the associated logic island 400 (TiZ_IXX, CQiZ_IXX), and produces one output (TR_OX), where Y indicates the distance from the highway network switch 700, X refers to the serial number of input pins of the highway network switch 700, i represents the index of the logic cell in a super logic cell, FT denotes "From Top," FL denotes "From Left," FB denotes "From Bottom," and TR denotes "To Right." For example, B2_I78 indicates the signal is coming from two units away from the bottom of the highway network switch 700 and this signal is fed into I78 input pin/terminal of the highway network switch 700. Similarly, TR_O6 means the signal is going to the right of the highway network switch 700 and this signal can be realized on the output pin/terminal O6 of the highway network switch 700.

By way of example, the highway network switch 700 may be similar to a Wilton switch structure, where some neighboring signals come from the immediate four neighbors and can take turn (i.e., change of direction) and one comes from the 4th neighbor that goes through without changing any direction. For routing fixed length wire segments are used, where the length is four units. In other words, a wire that originates from a highway network switch may travel to another highway network switch that is four highway network switches away, without turning. However, in order to provide the flexibility to connect the nearer highway network switches, the tapping from the wire at each unit length, i.e., at each highway network switch, is possible. Accordingly, signals may travel quickly to the most distant highway network switch as well reach a nearer highway network switch without creating substantial routing congestion.

Although the present invention is illustrated in connection with specific embodiments for instructional purposes, the present invention is not limited thereto. Various adaptations and modifications may be made without departing from the scope of the invention. For example, the number of specific input terminals, output terminals, and signals provided on each input terminal and output terminal may vary as desired. Moreover, while specific circuit elements, such as 7×1 multiplexors, are discussed, equivalent circuit elements, e.g., multiple multiplexors may be used. Therefore, the spirit and scope of the appended claims should not be limited to the foregoing description.

What is claimed is:

1. A programmable logic device comprising:
a plurality of logic blocks and an interconnecting network;
wherein each logic block in the plurality of logic blocks comprises a logic island and a routing network associated with the logic island, wherein the routing network comprises:
a network switch comprising a first stage of switch boxes and a second stage of switch boxes, wherein a first portion of output terminals of the first stage of switch boxes is connected directly to the logic island and is connected directly to a first set of input terminals of the second stage of switch boxes, and a second portion of output terminals of the first stage of switch boxes is connected to a second set of input terminals of the second stage of switch boxes.

2. The programmable logic device of claim 1, wherein at least a portion of output terminals of the second stage of switch boxes are connected to the logic island.

3. The programmable logic device of claim 1, wherein the logic island comprises a plurality of look-up tables, wherein the first portion of the output terminals of the first stage of switch boxes is connected directly to input terminals of the plurality of look-up tables.

4. The programmable logic device of claim 3, wherein output terminals of the second stage of switch boxes are connected to remaining input terminals of the plurality of look-up tables.

5. The programmable logic device of claim 1, wherein the network switch further comprises a third stage of switch boxes, wherein a first portion of output terminals of the second stage of switch boxes is connected directly to input terminals of the logic island, and a second portion of output terminals of the second stage of switch boxes is connected directly to input terminals of the third stage of switch boxes.

6. The programmable logic device of claim 5, wherein the first portion of the output terminals of the first stage of switch boxes is connected directly to a first set of input terminals of the logic island, the first portion of output terminals of the second stage of switch boxes is connected to a second set of input terminals of the logic island, and output terminals of the third stage of switch boxes are directly connected to a third set of input terminals of the logic island.

7. The programmable logic device of claim 5, wherein the network switch further receives clock signals, wherein one or more clock signals are provided to the logic island through one of the second stage of switch boxes or the third stage of switch boxes.

8. The programmable logic device of claim 1, wherein the routing network further comprises:
a feedback network comprising a feedback network switch, the feedback network switch receiving a first set of output signals from the logic island and producing feedback output signals, wherein the feedback output signals are received by the second stage of the network switch.

9. The programmable logic device of claim 8, wherein input terminals of the second stage of switch boxes are directly connected to output terminals of the logic island to directly receive a set of feedback output signals from the logic island, wherein the set of feedback output signals received by the second stage of switch boxes does not pass through the feedback network switch.

10. The programmable logic device of claim 8, wherein the feedback network switch of the logic block further receives output signals from logic islands in neighboring logic blocks.

11. The programmable logic device of claim 10, wherein the neighboring logic blocks comprise logic blocks that are nearest to the logic block in top, bottom, right, and left directions.

12. The programmable logic device of claim 11, wherein the neighboring logic blocks further comprise logic blocks that are nearest to the logic block in top-left, top-right, bottom-left, and bottom-right diagonal directions.

13. The programmable logic device of claim 8, wherein the routing network further comprises:
a highway network comprising a highway network switch, the highway network switch receiving a second set of output signals from the logic island, and receiving input signals from neighboring highway networks, the highway network switch providing output signals to the neighboring highway networks and neighboring street networks.

14. The programmable logic device of claim 13, wherein the neighboring highway networks comprise sets of highway networks that are adjacent to the logic block in top, bottom, right, and left directions.

15. The programmable logic device of claim 14, wherein each set of highway networks in each direction comprises at least four neighboring highway networks.

16. The programmable logic device of claim 13, wherein the network switch further receives the input signals from the neighboring highway networks.

17. The programmable logic device of claim 16, wherein the first stage of switch boxes in the network switch receives the input signals from the neighboring highway networks.

18. A programmable logic device comprising:
a plurality of logic blocks and an interconnecting network;
wherein each logic block in the plurality of logic blocks comprises a logic island and a routing network associated with the logic island, wherein the routing network comprises:
a network switch comprising a first stage of switch boxes, a second stage of switch boxes connected to the first stage of switch boxes, and a third stage of switch boxes connected to the second stage of switch boxes, wherein a first portion of output terminals of the first stage of switch boxes is connected directly to the logic island, a first portion of output terminals of the second stage of switch boxes is connected directly to the logic island, and output terminals of the third stage of switch boxes is connected directly to the logic island.

19. The programmable logic device of claim 18, wherein the first portion of output terminals of the first stage of switch boxes that is connected directly to the logic island is connected directly to a portion of input terminals of the second stage of switch boxes.

20. The programmable logic device of claim 18, wherein a first portion of output terminals of the second stage of switch boxes in the network switch is connected directly to the logic island, and a remaining portion of output terminals of the second stage of switch boxes is connected directly to input terminals of the third stage of switch boxes in the network switch.

21. The programmable logic device of claim 20, wherein the logic island comprises a plurality of look-up tables, wherein the first portion of output terminals of the second stage of switch boxes is connected to the input terminals of the plurality of look-up tables.

22. The programmable logic device of claim 18, wherein the network switch further receives clock signals, wherein the clock signals are provided to the logic island through at least one of the second stage of switch boxes and the third stage of switch boxes.

23. The programmable logic device of claim 18, wherein the routing network further comprises:
a feedback network comprising a feedback network switch, the feedback network switch receiving a first set of output signals from the logic island and producing feedback output signals;
wherein the second stage of switch boxes has a first set of input terminals that are coupled directly to the feedback network switch to receive the feedback output signals, a second set of input terminals that are coupled directly to output terminals of the first stage of switch boxes, and a third set of input terminals that are coupled directly to output terminals of the logic island.

24. The programmable logic device of claim 23, wherein the feedback network switch of the logic block further receives output signals from logic islands in neighboring logic blocks.

25. The programmable logic device of claim 24, wherein the neighboring logic blocks comprise logic blocks that are nearest to the logic block in top, bottom, right, and left directions.

26. The programmable logic device of claim 25, wherein the neighboring logic blocks further comprise logic blocks that are nearest to the logic block in top-left, top-right, bottom-left, and bottom-right diagonal directions.

27. The programmable logic device of claim 18, wherein the routing network further comprises:
a highway network comprising a highway network switch, the highway network switch receiving a second set of output signals from the logic island, and receiving input signals from neighboring highway networks, the highway network switch providing output signals to the neighboring highway networks and to neighboring street networks.

28. The programmable logic device of claim 27, wherein the neighboring highway networks comprise sets of highway networks that are adjacent to the logic block in top, bottom, right, and left directions.

29. The programmable logic device of claim 28, wherein each set of highway networks in each direction comprises at least four highway networks.

30. The programmable logic device of claim 27, wherein the first stage of switch boxes of the network switch is coupled to receive the input signals from the neighboring highway networks.

31. A programmable logic device comprising:
a plurality of logic blocks and an interconnecting network;
wherein each logic block in the plurality of logic blocks comprises a logic island and a routing network associated with the logic island, wherein the routing network comprises:
a feedback network comprising a feedback network switch, the feedback network switch receiving a first set of output signals from the logic island and producing feedback output signals; and
a street network comprising a street network switch, the street network switch comprising a first stage of switch boxes and a second stage of switch boxes connected to the first stage of switch boxes, wherein at least one switch box in the second stage of switch boxes has at least one input terminal coupled directly to the feedback network switch to receive the feedback output signals, and at least one switch box in the second stage of switch boxes has at least one input terminal coupled directly to the logic island to directly receive a second set of output signals from the logic island, wherein the set of output signals received by the second stage of switch boxes from the logic island does not pass through the feedback network switch.

32. The programmable logic device of claim 31, wherein the street network further comprising a third stage of switch boxes connected to the second stage of switch boxes, wherein a first portion of output terminals of the second stage of switch boxes in the street network switch is connected directly to the logic island, and a second portion of output terminals of the second stage of switch boxes is connected directly to input terminals of the third stage of switch boxes in the street network switch.

33. The programmable logic device of claim 32, wherein the output terminals of the third stage of switch boxes in the street network switch are connected to a second set of input terminals of the logic island.

34. The programmable logic device of claim 33, wherein output terminals of the first stage of switch boxes in the street network switch is connected directly to input terminals of the second stage of switch boxes in the street network switch, and a portion of the output terminals of the first stage of switch boxes in the street network switch is connected directly to a third set of input terminals of the logic island.

35. The programmable logic device of claim 32, wherein the second stage and the third stage of the street network switch further receives clock signals, wherein the clock signals are provided to the logic island through at least one of the second stage of switch boxes and the third stage of switch boxes.

36. The programmable logic device of claim 31, wherein the feedback network switch of the logic block further receives output signals from logic islands in neighboring logic blocks.

37. The programmable logic device of claim 36, wherein the neighboring logic blocks comprise logic blocks that are nearest to the logic block in top, bottom, right, and left directions.

38. The programmable logic device of claim 37, wherein the neighboring logic blocks further comprise logic blocks that are nearest to the logic block in top-left, top-right, bottom-left, and bottom-right diagonal directions.

39. The programmable logic device of claim 31, wherein the routing network further comprises:
a highway network comprising a highway network switch, the highway network switch receiving a third set of output signals from the logic island, and receiving input signals from neighboring highway networks, the highway network switch providing output signals to the neighboring highway networks and neighboring street networks.

40. The programmable logic device of claim 39, wherein the neighboring highway networks comprise sets of highway networks that are adjacent to the logic block in top, bottom, right, and left directions.

41. The programmable logic device of claim 40, wherein each set of highway networks in each direction comprises at least four neighboring highway networks.

42. The programmable logic device of claim 40, wherein the street network switch further receives the input signals from the neighboring highway networks.

43. The programmable logic device of claim 42 wherein the first stage of switch boxes in the street network switch receives the input signals from the neighboring highway networks.

* * * * *